United States Patent
Miyasaka et al.

(10) Patent No.: US 8,592,130 B2
(45) Date of Patent: Nov. 26, 2013

(54) PHOTOSENSITIVE RESIN COMPOSITION, PHOTOSENSITIVE ELEMENT, METHOD OF FORMING RESIST PATTERN AND METHOD OF PRODUCING PRINTED WIRING BOARD

(75) Inventors: Masahiro Miyasaka, Hitachi (JP); Yukiko Muramatsu, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 19 days.

(21) Appl. No.: 12/995,301

(22) PCT Filed: May 22, 2009

(86) PCT No.: PCT/JP2009/059440
§ 371 (c)(1),
(2), (4) Date: Mar. 3, 2011

(87) PCT Pub. No.: WO2009/145120
PCT Pub. Date: Dec. 3, 2009

(65) Prior Publication Data
US 2011/0159430 A1 Jun. 30, 2011

(30) Foreign Application Priority Data
May 30, 2008 (JP) ................ P2008-143541

(51) Int. Cl.
*G03F 7/00* (2006.01)
*G03F 7/004* (2006.01)
*G03F 7/028* (2006.01)
*G03F 7/11* (2006.01)
*G03F 7/40* (2006.01)

(52) U.S. Cl.
USPC .............. 430/270.1; 430/281.1; 430/286.1; 430/311; 430/317; 430/322; 430/905; 430/331

(58) Field of Classification Search
USPC ........ 430/270.1, 281.1, 286.1, 913, 311, 322, 430/331, 317, 319
See application file for complete search history.

(56) References Cited

U.S. PATENT DOCUMENTS

| | | | |
|---|---|---|---|
| 5,556,734 A * | 9/1996 | Yamachika et al. | 430/270.1 |
| 6,727,039 B2 * | 4/2004 | Sato | 430/270.1 |
| 6,808,860 B2 * | 10/2004 | Sato et al. | 430/270.1 |
| 6,808,862 B2 * | 10/2004 | Kodama | 430/270.1 |
| 6,919,160 B2 * | 7/2005 | Abdourazak et al. | 430/270.1 |
| 7,179,578 B2 * | 2/2007 | Sato et al. | 430/270.1 |
| 7,186,495 B2 * | 3/2007 | Maeda et al. | 430/270.1 |
| 7,285,369 B2 * | 10/2007 | Takahashi | 430/270.1 |
| 7,488,566 B2 * | 2/2009 | Tsuji et al. | 430/270.1 |
| 7,514,201 B2 * | 4/2009 | Fujimori | 430/270.1 |

FOREIGN PATENT DOCUMENTS

| | | | |
|---|---|---|---|
| CN | 1945429 A | | 4/2007 |
| JP | 5-224417 | | 9/1993 |
| JP | 2005-003953 | | 1/2005 |
| JP | 2005-122123 | | 5/2005 |
| JP | 2006145844 A | * | 6/2006 |
| JP | 2006-234995 | | 9/2006 |
| JP | 2006-293024 | | 10/2006 |
| JP | 2007-102117 | | 4/2007 |
| JP | 2008-102326 | | 5/2008 |
| JP | 2009-003000 | | 1/2009 |

OTHER PUBLICATIONS

Machine translation of JP 2006-145844 (no date).*
International Preliminary Report on Patentability of corresponding application No. PCT/JP2009/059440 issued Jan. 11, 2011 and mailed Jan. 20, 2011.
International Search Report issued in corresponding application No. PCT/JP2009/059440, completed Jun. 23, 2009 and mailed Jul. 7, 2009.
Office Action issued Jan. 21, 2012 in a counterpart Chinese application 200980110801.X (no translation available; submitted for certification).

Office Action issued Feb. 7, 2012 in a counterpart Japanese application P2010-514458 (no translation available; submitted for certification).

\* cited by examiner

*Primary Examiner* — Amanda C. Walke
(74) *Attorney, Agent, or Firm* — Griffin & Szipl, P.C.

(57) ABSTRACT

A photosensitive resin composition comprising: (A) a binder polymer having a divalent group represented by formula (I), (II) and (III); (B) a photopolymerizing compound; and (C) a photopolymerization initiator.

[Chemical Formula 1]

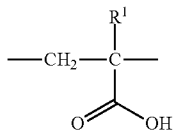

(I)

[Chemical Formula 2]

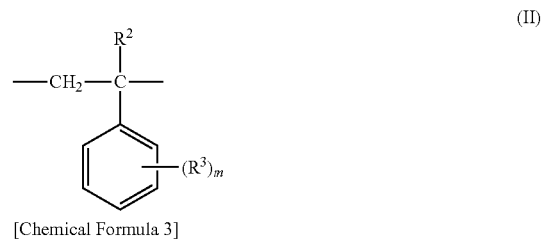

(II)

[Chemical Formula 3]

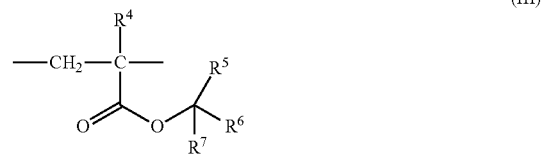

(III)

[In formulas (I), (II) and (III), $R^1$, $R^2$, $R^4$ each independently represents a hydrogen atom or a methyl group, $R^3$ is C1-C3 alkyl group, etc., m is an integer of 0-5, $R^5$, $R^6$ and $R^7$ each independently represents a hydrogen atom or a C1-C5 alkyl group, and at least two among $R^5$, $R^6$ and $R^7$ are C1-C5 alkyl groups.]

7 Claims, 1 Drawing Sheet

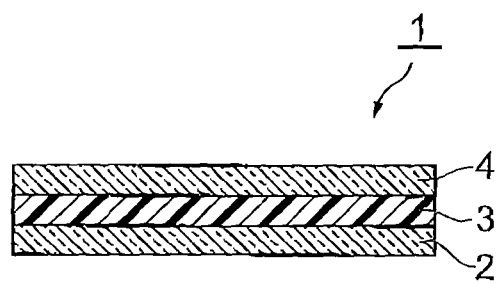

PHOTOSENSITIVE RESIN COMPOSITION, PHOTOSENSITIVE ELEMENT, METHOD OF FORMING RESIST PATTERN AND METHOD OF PRODUCING PRINTED WIRING BOARD

This is a National Phase Application in the United States of International Patent Application No. PCT/JP2009/059440 filed May 22, 2009, which claims priority on Japanese Patent Application No. P2008-143541, filed May 30, 2008. The entire disclosures of the above patent applications are hereby incorporated by reference.

TECHNICAL FIELD

The present invention relates to a photosensitive resin composition, a photosensitive element, a method of forming a resist pattern and a method of producing a printed wiring board.

BACKGROUND ART

In the field of printed wiring board manufacturing there are commonly employed photosensitive elements (laminated bodies) having a structure wherein a photosensitive resin composition or a layer comprising the photosensitive resin composition (hereinafter referred to as "photosensitive resin composition layer") is formed on a support film, as a resist material for etching or plating, and a protective film is situated on the photosensitive resin composition layer.

Printed wiring boards have conventionally been produced, using such photosensitive elements, by the following procedure. Specifically, the photosensitive resin composition layer of the photosensitive element is first laminated onto a circuit-forming board such as a copper-clad laminate. The side of the photosensitive resin composition layer (hereinafter referred to as the "upper side" of the photosensitive resin composition layer) opposite from the side in contact with the support film (hereinafter referred to as the "lower side" of the photosensitive resin composition layer), is contact bonded to the side of the circuit-forming board on which the circuit is to be formed. Therefore when the protective film is positioned on the upper side of the photosensitive resin composition layer, the lamination operation is carried out while peeling off the protective film. The lamination is accomplished by thermocompression bonding the photosensitive resin composition layer to a ground layer circuit-forming board (ordinary pressure lamination).

The photosensitive resin composition layer is then subjected to pattern exposure through a mask film or the like. The support film is released at a timing of either before or after the exposure. The unexposed sections of the photosensitive resin composition layer are removed by dissolution or dispersion with a developing solution. Etching treatment or plating treatment is then performed to form a pattern, and finally the cured sections are peeled off.

The etching treatment referred to here is a method for etching removal of the metal surface of a circuit-forming board that is not covered with the cured resist formed after development, and then releasing the cured resist. Plating treatment, on the other hand, is a method that involves plating treatment with copper or solder on the metal surface of a circuit-forming board that is not covered with the cured resist formed after development, removing the cured resist and then etching the metal surface that has been covered by the resist.

Incidentally, the method for the pattern exposure may be a conventional method for using a mercury lamp as the light source for exposure through a photomask. In recent years, direct writing exposure has been proposed as a new exposure technology of DLP (Digital Light Processing), wherein the digital data of a pattern is directly drawn onto a photosensitive resin composition layer. Direct writing exposure has more satisfactory positioning precision than exposure through photomasks, while fine patterns can also be obtained, and it is therefore being introduced for formation of high-density package boards.

In pattern exposure, the exposure time must be shortened as much as possible to improve the production throughput. In the direct writing exposure mentioned above, a long exposure time will generally be necessary when using a composition with sensitivity comparable to that of a photosensitive resin composition used for conventional exposure through a photomask. It is therefore necessary to increase the illuminance on the exposure device side or increase the sensitivity of the photosensitive resin composition.

It is important for the photosensitive resin composition to have excellent resolution and adhesiveness, as well as an excellent resist release property, in addition to sensitivity. If the photosensitive resin composition can provide a resist pattern with excellent resolution and adhesiveness, it will be possible to sufficiently reduce short circuits and wire breaks.

If the photosensitive resin composition is able to form a resist with an excellent release property, the shorter resist release time will improve the resist pattern forming efficiency, and a smaller size of the resist release sections will reduce resist release residue and improve the yield of circuit formation.

In a high-density package board, it is also important for the resist shape to be excellent because of the narrow widths between circuits. If the cross-sectional shape of the resist is trapezoidal or reverse trapezoidal, or the resist has skirt trailing, the circuit formed by the subsequent etching treatment or plating treatment may exhibit shorting or wire breakage. The resist shape is therefore preferably rectangular.

Photosensitive resin compositions employing specific binder polymers, photopolymerization initiators or the like have been studied to meet this need (see Patent documents 1 and 2, for example).

CITATION LIST

Patent Literature

[Patent document 1] Japanese Unexamined Patent Application Publication No. 2006-234995
[Patent document 2] Japanese Unexamined Patent Application Publication No. 2005-122123

SUMMARY OF INVENTION

Technical Problem

The photosensitive resin compositions described in Patent documents 1 and 2, however, have not been fully satisfactory in terms of sensitivity, resolution and adhesiveness while maintaining a satisfactory shape of the formed resist pattern and release property of the resist.

It is therefore an object of the present invention to provide a photosensitive resin composition that allows formation of resist patterns with excellent sensitivity, resolution and adhesiveness, and fully satisfactory resist shapes and release properties, as well as a photosensitive element, and a method for forming a resist pattern employing it, and method for producing a printed wiring board.

Solution to Problem

In order to achieve the object stated above, the invention provides a photosensitive resin composition comprising: (A) a binder polymer having a divalent group represented by formula (I), (II) and (III); (B) a photopolymerizing compound; and (C) a photopolymerization initiator.

[Chemical Formula 1]

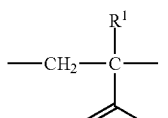

(I)

[Chemical Formula 2]

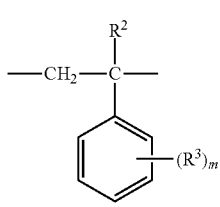

(II)

[Chemical Formula 3]

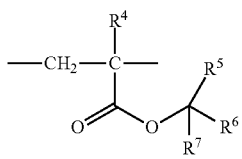

(III)

[In formulas (I), (II) and (III), $R^1$, $R^2$ and $R^4$ each independently represents a hydrogen atom or a methyl group, $R^3$ represents a C1-C3 alkyl group, a C1-C3 alkoxy group, a hydroxyl group, an amino group or a halogen atom, m represents an integer of 0-5, and when m is 2-5, a plurality of the groups in $R^3$ may be the same or different. $R^5$, $R^6$ and $R^7$ each independently represents a hydrogen atom or a C1-C5 alkyl group, and at least two of $R^5$, $R^6$ and $R^7$ are C1-C5 alkyl groups.]

The photosensitive resin composition of the invention, which is composed of the specific components mentioned above, can particularly improve the resolution and adhesiveness and can satisfactorily form a resist pattern shape.

The reason for this effect is not thoroughly understood, but the present inventors offer the following conjecture. Swelling and contraction of the resist during the developing step is thought to be a highly potential cause for poor resolution, adhesiveness and resist shape. That is, when permeation of the developing solution into the unexposed sections, as the sections to be dissolved, is poor during development, dissolution residue (skirt trailing) of the resist results. The resist also often exhibits swelling or crumbling. These phenomena are attributed to the stress of swelling of the resist during development, or swelling of the resist during development and contraction of the resist during the subsequent rinsing. In order to inhibit swelling of the resist during development, it was attempted to introduce a hydrophobic alkyl group into the structural unit of the binder polymer (A). A straight-chain alkyl group is highly flexible and was considered to have minimal effect on inhibiting swelling, and therefore it was attempted to introduce a binder polymer having a divalent group represented by formula (III), as a bulky rigid branched alkyl group wherein the carbon bonded to the oxygen of the ester group was a secondary or tertiary carbon. Using a binder polymer (A) composed of the combination of specific components described above, the photosensitive resin composition of the invention can form a resist pattern with excellent sensitivity, resolution and adhesiveness and a satisfactory resist shape, even when the resist pattern is formed by direct writing exposure.

The photosensitive resin composition of the invention also has a sufficient release property for the resist pattern that is to be formed from it. Thus, using the photosensitive resin composition of the invention to form a resist pattern or printed wiring board can help shorten the process and improve the product yield.

The (C) photopolymerization initiator in the photosensitive resin composition of the invention preferably contains a hexaarylbiimidazole derivative. This can increase the sensitivity of the photosensitive resin composition while further improving the resolution and adhesiveness.

The photosensitive resin composition of the invention preferably further comprises (D) a sensitizing dye. This can maximize absorption near a specific wavelength range, when exposure is accomplished using light having a peak in the specific wavelength range, and can increase the sensitivity of the photosensitive resin composition.

The photosensitive resin composition of the invention preferably further comprises (E) an amine-based compound. This can still further increase the sensitivity of the photosensitive resin composition.

The invention also provides a photosensitive element comprising a support film and a photosensitive resin composition layer composed of the aforementioned photosensitive resin composition formed on the support film.

The photosensitive element of the invention is able to exhibit a good balance between sensitivity, resolution and adhesiveness, with a satisfactorily formed resist pattern shape, since it comprises a photosensitive resin composition layer composed of the photosensitive resin composition of the invention.

The invention still further provides a method for forming a resist pattern that comprises a lamination step in which a photosensitive resin composition layer composed of the photosensitive resin composition of the invention is laminated on a circuit-forming board, an exposure step in which prescribed sections of the photosensitive resin composition layer are irradiated with active light rays for photocuring of the exposed sections, and a developing step in which the sections other than the exposed sections of the photosensitive resin composition layer are removed from the circuit-forming board.

According to the method for forming a resist pattern of the invention, a photosensitive resin composition of the invention having excellent sensitivity, resolution and adhesiveness is used to form a resist pattern, and it is therefore possible to efficiently form a resist pattern with sensitivity, resolution and adhesiveness and having an excellent resist shape, even when a laser direct writing method is employed.

The invention still further provides a method for forming a resist pattern wherein the exposure step is a step in which the photosensitive resin composition layer is subjected to direct writing exposure with laser light for photocuring of the exposed sections.

This method for forming a resist pattern can more efficiently form a resist pattern having a satisfactory resist shape, because exposure by a laser direct writing method is carried out using a photosensitive resin composition or photosensitive element of the invention having excellent sensitivity, resolution and adhesiveness.

The invention yet further provides a method for producing a printed wiring board wherein a circuit-forming board having a resist pattern formed by the method for forming a resist pattern of the invention is etched or plated to form a conductor pattern.

Since a resist pattern is formed by the method for forming a resist pattern of the invention in the method for producing a printed wiring board of the invention, it is possible to efficiently produce printed wiring boards and realize higher densities of wirings.

Advantageous Effects of Invention

According to the photosensitive resin composition of the invention it is possible to provide a photosensitive resin composition that allows formation of resist patterns with excellent sensitivity, resolution and adhesiveness, and fully satisfactory resist shapes and release properties, as well as a photosensitive element, and a method for forming a resist pattern employing it and method for producing a printed wiring board.

BRIEF DESCRIPTION OF DRAWINGS

FIG. 1 is a schematic cross-sectional view showing a preferred embodiment of a photosensitive element of the invention.

DESCRIPTION OF EMBODIMENTS

Preferred embodiments of the invention will now be described in detail. The term "(meth)acrylic acid" used in the present specification refers to "acrylic acid" and its corresponding "methacrylic acid", while "(meth)acrylate" refers to "acrylate" and its corresponding "methacrylate".

(Photosensitive Resin Composition)

The photosensitive resin composition of the invention comprises (A) a binder polymer, (B) a photopolymerizing compound and (C) a photopolymerization initiator.

The binder polymer as component (A) will be explained first.

The binder polymer as the component (A) comprises a structural unit based on (meth)acrylic acid represented by formula (I), a structural unit based on styrene or its derivative represented by formula (II), and a structural unit represented by formula (III). This can improve especially the resolution and adhesiveness while maintaining satisfactory sensitivity and release properties of the photosensitive resin composition, and forming satisfactory resist pattern shapes.

[Chemical Formula 4]

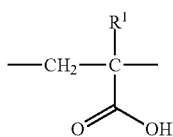

(I)

[Chemical Formula 5]

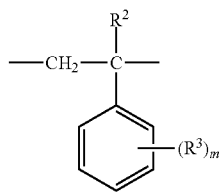

(II)

[Chemical Formula 6]

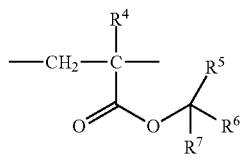

(III)

In formula (I), $R^1$ represents a hydrogen atom or a methyl group, and specifically the compound is a structural unit based on acrylic acid or methacrylic acid. $R^1$ is preferably a methyl group.

In formula (II), $R^2$ represents a hydrogen atom or a methyl group, and $R^3$ represents a C1-C3 alkyl group, a C1-C3 alkoxy group, a hydroxyl group, an amino group or a halogen atom. The letter m represents an integer of 0-5, preferably 0-3 and more preferably 0-2. When m is 2-5, a plurality of the groups in $R^3$ may be the same or different. $R^2$ is preferably hydrogen.

The structural unit represented by formula (II) can be obtained from styrene or its derivative (wherein $R^2$ is a hydrogen atom), and α-methylstyrene or its derivative (wherein $R^2$ is a methyl group), as polymerizable monomers. Specific examples of styrene derivatives include methylstyrene, ethylstyrene, hydroxystyrene, butoxystyrene, chlorostyrene, bromostyrene and aminostyrene. For the purpose of the invention, the terms "styrene derivative" and "α-methylstyrene derivative" refers to styrene or α-methylstyrene wherein a hydrogen of the aromatic ring has been replaced with a substituent (an organic group such as an alkyl group, a halogen atom, or the like).

In formula (III), $R^4$ represents a hydrogen atom or a methyl group. $R^5$, $R^6$ and $R^7$ each independently represents a hydrogen atom or a C1-C5 alkyl group, and at least two of $R^5$, $R^6$ and $R^7$ are C1-C5 alkyl groups. Examples of C1-C5 alkyl groups include methyl group, ethyl group, propyl group, isopropyl group, butyl group, t-butyl group and pentyl group. $R^4$ is preferably a methyl group. The C1-C5 alkyl groups represented by $R^5$, $R^6$ and $R^7$ are preferably C1-C3 alkyl groups and more preferably C1-C2 alkyl groups. The total number of carbon atoms of $R^5$, $R^6$ and $R^7$ is preferably 2-10, more preferably 3-9 and even more preferably 3-6.

The divalent group represented by formula (III) may be, for example, a (meth)acrylic acid ester such as t-butyl (meth)acrylate ester, isopropyl (meth)acrylate ester, sec-butyl (meth)acrylate ester, 1,1-dimethylpropyl (meth)acrylate ester, 1,1-diethylpropyl (meth)acrylate ester, 1,1-dimethylbutyl (meth)acrylate ester and 1,1-diethylbutyl (meth)acrylate ester, as polymerizable monomers.

The divalent group represented by formula (III) is preferably a structural unit obtained from t-butyl (meth)acrylate ester or isopropyl (meth)acrylate ester as a polymerizable monomer, and is more preferably a structural unit obtained from t-butyl (meth)acrylate ester.

The content of the divalent group represented by formula (I) is preferably 10-60% by mass, more preferably 15-50% by mass, even more preferably 20-40% by mass and most preferably 25-35% by mass, with respect to the total weight of the binder polymer, from the viewpoint of the developing property of the photosensitive resin composition, the resolution and adhesiveness, and the release properties of the cured film formed by photocuring the photosensitive resin composition. When the content is less than 10% by mass the alkaline solubility tends to be poor, the release strips tend to be larger and the releasing time tends to be lengthened, while when it is greater than 60% by mass, the resolution tends to be lowered.

The content of the divalent group represented by formula (II) is preferably 10-70% by mass, more preferably 15-65% by mass, even more preferably 20-60% by mass and most preferably 25-55% by mass, with respect to the total weight of the binder polymer, from the viewpoint of obtaining a photosensitive resin composition layer with satisfactory adhesiveness for boards and a satisfactory release property for the cured film. When the content is less than 10% by mass, the adhesiveness tends to be poor, and when it is greater than 70% by mass, the release strips tend to be larger and the releasing time tends to be lengthened.

The content of the divalent group represented by formula (III) is preferably 5-60% by mass, more preferably 10-55% by mass, even more preferably 15-50% by mass and most preferably 20-45% by mass, based on the total weight of the binder polymer molecule, from the viewpoint of resolution and adhesiveness, and from the viewpoint of obtaining a satisfactory resist shape and release property. When the content is less than 5% by mass, the resolution and adhesiveness tends to be inferior and the resist shape tends to be impaired, while when it is greater than 60% by mass, the release strips tend to be larger and the release time tends to be lengthened.

Such binder polymers may be used alone as single binder polymers, or they may be used in any desired combinations of two or more binder polymers. Examples of binder polymers employing combinations of two or more types include two or more binder polymers composed of different copolymerizing components (including those with different repeating units as the constituent components), two or more binder polymers with different weight-average molecular weights, and two or more binder polymers with different dispersities. There may also be used a polymer having a multimode molecular weight distribution, as described in Japanese Unexamined Patent Application Publication HEI No. 11-327137.

The weight-average molecular weight (Mw) and number-average molecular weight (Mn) of the binder polymer may be measured by gel permeation chromatography (GPC) (the value calculated with a calibration curve using standard polystyrene).

Based on this manner of measurement, the Mw of the binder polymer is preferably 5000-300,000, more preferably 10,000-150,000 and even more preferably 20,000-100,000 and most preferably 30,000-70,000. An Mw value of less than 5000 tends to result in lower developing solution resistance, and a value of greater than 300,000 tends to lengthen the developing time.

The (A) binder polymer has a dispersity (Mw/Mn) of preferably 1.0-3.0 and more preferably 1.0-2.0. A dispersity of greater than 3.0 tends to lower the adhesiveness and resolution.

The (A) binder polymer may also be used together with a styrene-based resin, epoxy-based resin, amide-based resin, amide-epoxy-based resin, alkyd-based resin or phenol-based resin.

The (A) binder polymer of the invention may be produced, for example, by radical polymerization of a polymerizable monomer. The (A) binder polymer of the invention may be used in combination with a polymerizable monomer other than the polymerizable monomer used to formula (I)-(III). Examples of polymerizable monomers other than the polymerizable monomer used to formula (I)-(III) include compounds represented by formula (IV), and compounds having the alkyl groups substituted by a hydroxyl group, an epoxy group or a halogen group.

$$CH_2=C(R^8)-COOR^9 \qquad (IV)$$

[In the formula, $R^8$ represents a hydrogen atom or a methyl group, and $R^9$ represents a monovalent organic group of a C1-C12 alkyl group or a C1-C12 alkyl group substituted by a hydroxyl group, an epoxy group, a halogen atom or the like.]

Examples of compounds represented by formula (IV) wherein the substituent $R^9$ is a C1-C12 alkyl group include methyl (meth)acrylate ester, ethyl (meth)acrylate ester, propyl (meth)acrylate ester, butyl (meth)acrylate ester, pentyl (meth)acrylate ester, hexyl (meth)acrylate ester, heptyl (meth)acrylate ester, octyl (meth)acrylate ester, 2-ethylhexyl (meth)acrylate ester, nonyl (meth)acrylate ester, decyl (meth)acrylate ester, undecyl (meth)acrylate ester, dodecyl (meth)acrylate ester, 2-hydroxyethyl, 2-hydroxypropyl, 3-hydroxypropyl and 4-hydroxybutyl. These may also be used alone or in any desired combinations of two or more.

Others include acrylamides such as diacetoneacrylamide; acrylonitrile; vinyl alcohol esters such as vinyl-normal-butyl ester; tetrahydrofurfuryl (meth)acrylate ester, tetrahydropyranyl (meth)acrylate ester, adamantyl (meth)acrylate ester, dimethylaminoethyl (meth)acrylate ester, diethylaminoethyl (meth)acrylate ester, glycidyl (meth)acrylate ester, benzyl (meth)acrylate, 2,2,2-trifluoroethyl (meth)acrylate, 2,2,3,3-tetrafluoropropyl (meth)acrylate, α-bromo(meth)acrylic acid, α-chlor(meth)acrylic acid, β-furyl (meth)acrylic acid, β-styryl (meth)acrylic acid, maleic acid, maleic anhydride, maleic acid monoesters such as monomethyl malate, monoethyl malate and monoisopropyl malate, fumaric acid, cinnamic acid, α-cyanocinnamic acid, itaconic acid, crotonic acid, propiolic acid and the like. These compounds may be used alone or in any desired combinations of two or more.

The (A) binder polymer used according to the invention preferably consists of one or more polymers with carboxyl groups, from the viewpoint of the developing property when the alkali solution is used for alkali development. Such a binder polymer (A) may be obtained, for example, by radical polymerization of a carboxyl group-containing polymerizable monomer with another polymerizable monomer.

The acid value of the (A) binder polymer is preferably 30-300 mgKOH/g, more preferably 70-270 mgKOH/g, even more preferably 100-250 mgKOH/g, yet more preferably 120-200 mgKOH/g and most preferably 150-200 mgKOH/g. When the acid value is less than 30 mgKOH/g, the developing time tends to be longer, and when it is greater than 300 mgKOH/g, the developing solution resistance of the photocured resist tends to be reduced. When solvent development is carried out as the developing step, it is preferred to adjust the carboxyl group-containing polymerizable monomer to a smaller amount.

The (A) binder polymer may contain characteristic groups with photosensitivity if necessary in the molecule.

The content of the (A) binder polymer is preferably 30-70 parts by weight, more preferably 35-65 parts by weight and even more preferably 40-60 parts by weight based on a total of 100 parts by weight for the component (A) and the component (B). A content of less than 30 parts by weight tends to prevent a satisfactory pattern shape from being obtained, while a content of greater than 70 parts by weight tends to prevent satisfactory sensitivity and resolution from being obtained.

The photopolymerizing compound as the component (B) will now be described.

Examples of the (B) photopolymerizing compound include (B1) a photopolymerizable unsaturated compound with one polymerizable ethylenic unsaturated bond in the molecule, and (B2) a photopolymerizable unsaturated compound with two or more polymerizable ethylenic unsaturated bonds in the molecule.

The (B1) photopolymerizable unsaturated compound with one polymerizable ethylenic unsaturated bond in the molecule may be the phthalic acid-based compound represented by formula (V), or nonylphenoxypolyethylene oxyacrylate, an alkyl (meth)acrylate ester or the like. The (B2) photopolymerizable unsaturated compound with two or more polymerizable ethylenic unsaturated bonds in the molecule may be a bisphenol A-based (meth)acrylate compound represented by formula (VI), a compound obtained by reacting an α,β-unsaturated carboxylic acid with a polyhydric alcohol, a compound obtained by reacting an α,β-unsaturated carboxylic acid with a glycidyl group-containing compound, or a urethane monomer such as a (meth)acrylate compound having a urethane bond in the molecule. These may be used alone or in combinations of two or more, and preferably a combination of component (B1) and component (B2) is used from the viewpoint of more reliably achieving the effect of the invention.

[Chemical Formula 7]

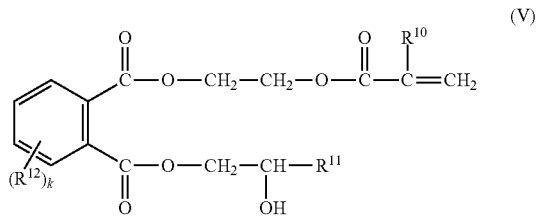

(V)

[In the formula, $R^{10}$ represents a hydrogen atom or a methyl group, $R^{11}$ represents a hydrogen atom, a methyl group or a halogenated methyl group, $R^{12}$ represents a C1-C6 alkyl group, a halogen atom or a hydroxyl group, and k represents an integer of 0-4. When k is 2 or greater, a plurality of the groups in $R^{12}$ may be the same or different.]

From the viewpoint of shortening the releasing time, the (B1) compound with one ethylenic unsaturated group in the molecule is preferably contained, and from the viewpoint of further improving the resolution and adhesiveness, a phthalic acid-based compound represented by formula (V) is preferably contained.

The phthalic acid-based compound represented by formula (V) may be, for example, γ-chloro-β-hydroxypropyl-β'-(meth)acryloyloxyethyl-o-phthalate or β-hydroxyalkyl-β'-(meth)acryloyloxyalkyl-o-phthalate. These may be used alone or in any desired combinations of two or more.

Examples of nonylphenoxypolyethylene oxyacrylates include nonylphenoxytetraethylene oxyacrylate, nonylphenoxypentaethylene oxyacrylate, nonylphenoxyhexaethylene oxyacrylate, nonylphenoxyheptaethylene oxyacrylate, nonylphenoxyoctaethylene oxyacrylate, nonylphenoxynonaethylene oxyacrylate, nonylphenoxydecaethylene oxyacrylate and nonylphenoxyundecaethylene oxyacrylate. These may be used alone or in any desired combinations of two or more.

When the (B1) photopolymerizable unsaturated compound with one polymerizable ethylenic unsaturated bond in the molecule is used, the content is preferably 1-15 parts by weight and more preferably 2-10 parts by weight with respect to 100 parts by weight as the total of the component (A) and the component (B). When the content exceeds 15 parts by weight, the resolution and adhesiveness tends to be reduced.

(B2) Photopolymerizable unsaturated compound with two or more polymerizable ethylenic unsaturated bonds in the molecule:

The component (B) of this embodiment preferably contains a bisphenol A-based (meth)acrylate compound from the viewpoint of improving sensitivity, resolution and adhesiveness.

Bisphenol A-based (meth)acrylate compounds represented by formula (VI) above include 2,2-bis(4-((meth)acryloxypolyethoxy)phenyl)propanes, 2,2-bis(4-((meth)acryloxypolypropoxy)phenyl)propanes, 2,2-bis(4-((meth)acryloxypolybutoxy)phenyl)propanes and 2,2-bis(4-((meth)acryloxypolyethoxypolypropoxy)phenyl)propanes.

Examples of 2,2-bis(4-((meth)acryloxypolyethoxy)phenyl) propanes include 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane and 2,2-bis(4-((meth)acryloxyhexadecaethoxy)phenyl)propane.

[Chemical Formula 8]

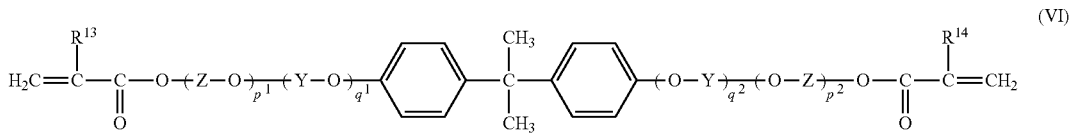

(VI)

[In the formula, $R^{13}$ and $R^{14}$ each independently represents a hydrogen atom or a methyl group, Y and Z each independently represents a C1-C6 alkylene group, and $p^1$, $p^2$, $q^1$ and $q^2$ represent integers of 0-20, selected so that $p^1+p^2+q^1+q^2$ is an integer of 0-40.]

(B1) Photopolymerizable unsaturated compound with one polymerizable ethylenic unsaturated bond in the molecule:

The compound 2,2-bis(4-(methacryloxypentaethoxy)phenyl)propane is commercially available as BPE-500 (product name of Shin-Nakamura Chemical Co., Ltd.) or FA-321 M (product name of Hitachi Chemical Co., Ltd.), 2,2-bis(4-(methacryloxypentadecaethoxy)phenyl)propane is commercially available as BPE-1300 (product name of Shin-Nakamura Chemical Co., Ltd.), and 2,2-bis[4-(methacryloylethoxy)phenyl]propane is commercially available as BPE-100 (product name of Shin-Nakamura Chemical Co., Ltd.).

From the viewpoint of cured product flexibility, resolution and adhesiveness, a compound of formula (VI) wherein $p^1+p^2+q^1+q^2$ is an integer of 4-40 is preferably included, which is preferably a 2,2-bis(4-((meth)acryloxypolyethoxy)phenyl)propane compound wherein the number of ethylene oxide groups per molecule is an integer of 4-20, and more preferably an integer of 8-15.

When a compound of formula (VI) wherein $p^1+p^2+q^1+q^2$ is an integer of 4-40 is included, the content is preferably 1-20 parts by weight and more preferably 5-15 parts by weight with respect to 100 parts by weight of the total of the component (A) and the component (B).

Compounds of formula (VI) wherein $p^1+p^2+q^1+q^2$ is an integer of 4-40 include 2,2-bis(4-(methacryloxypentaethoxy)phenyl)propane and 2,2-bis(4-(methacryloxypentadecaethoxy)phenyl)propane.

From the viewpoint of improving the resolution, adhesiveness and release property, a compound of formula (VI) wherein $p^1+p^2+q^1+q^2$ is an integer of 1-3 is preferably included. When a compound of formula (VI) wherein $p^1+p^2+q^1+q^2$ is an integer of 1-3 is included, the content is preferably 1-15 parts by weight and more preferably 5-15 parts by weight with respect to 100 parts by weight of the total of the component (A) and the component (B). A content of greater than 20 parts by weight tends to produce defects in the resist pattern. These may be used alone or in any desired combinations of two or more.

Examples of compounds of formula (VI) wherein $p^1+p^2+q^1+q^2$ is an integer of 1-3 include 2,2-bis[4-(methacryloylethoxy)phenyl]propane.

Examples of compounds obtained by reacting an α,β-unsaturated carboxylic acids with a polyhydric alcohol include polyalkyleneglycol di(meth)acrylates, such as polyethyleneglycol di(meth)acrylate having 2-14 ethylene groups, polypropyleneglycol di(meth)acrylate having 2-14 propylene groups and polyethylene-polypropyleneglycol di(meth)acrylate having 2-14 ethylene groups and 2-14 propylene groups, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, tetramethylolmethane tri(meth)acrylate, tetramethylolmethane tetra(meth)acrylate, dipentaerythritol penta(meth)acrylate, dipentaerythritol hexa(meth)acrylate, and the like. They may be used alone or in combinations of two or more.

"EO" stands for ethylene oxide, and an EO-modified compound has a block structure of ethylene oxide groups. "PO" stands for propylene oxide, and a PO-modified compound has a block structure of propylene oxide groups.

Examples of (meth)acrylate compounds having urethane bonds in the molecule include addition reaction products of (meth)acrylic monomers with an OH group at the β position and diisocyanate compounds (isophorone diisocyanate, 2,6-toluene diisocyanate, 2,4-toluene diisocyanate, 1,6-hexamethylene diisocyanate and the like), as well as tris((meth)acryloxytetraethyleneglycol isocyanate)hexamethylene isocyanurate, EO-modified urethane di(meth)acrylate and EO,PO-modified urethane di(meth)acrylate. An example of an EO-modified urethane di(meth)acrylate compound is UA-11 (product of Shin-Nakamura Chemical Co., Ltd.). An example of an EO,PO-modified urethane di(meth)acrylate compound is UA-13 (product of Shin-Nakamura Chemical Co., Ltd.). These may be used alone or in combinations of two or more.

The component (B2) of the invention preferably contains a polyalkyleneglycol di(meth)acrylate having both an ethylene glycol chain and a propylene glycol chain in the molecule, from the viewpoint of improving the flexibility of the cured film. The (meth)acrylate is not particularly restricted so long as it has both an ethylene glycol chain and a propylene glycol chain (normal-propylene glycol chain or isopropylene glycol chain) as alkylene glycol chains in the molecule. The (meth)acrylate may further have a normal-butylene glycol chain, an isobutylene glycol chain, a normal-pentylene glycol chain or a hexylene glycol chain, or an approximately C4-C6 alkylene glycol chain which is a structural isomer of the foregoing.

When a plurality of ethylene glycol chains and propylene glycol chains are present, the plurality of ethylene glycol chains and propylene glycol chains do not need to be arranged continuously in a block manner but may be random. Also, in the isopropylene glycol chain, the secondary carbon of the propylene group may be bonded to an oxygen atom or the primary carbon may be bonded to an oxygen atom.

The alkylene glycol chains in the molecule of a polyalkyleneglycol di(meth)acrylate having both ethylene glycol chains and propylene glycol chains in the molecule may be, for example, compounds represented by formula (VII), compounds represented by formula (VIII) or compounds represented by formula (IX). These may be used alone or in combinations of two or more.

[Chemical Formula 9]

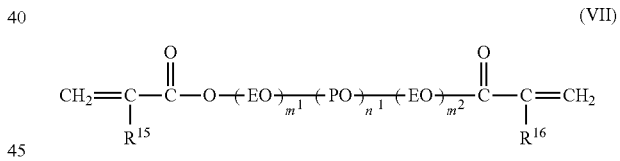

(VII)

[In the formula, $R^{15}$ and $R^{16}$ each independently represents a hydrogen atom or a C1-C3 alkyl group, EO represents an ethylene glycol chain, PO represents a propylene glycol chain, $m^1+m^2$ (average) is an integer of 1-30, and $n^1$ is an integer of 1-30.]

[Chemical Formula 10]

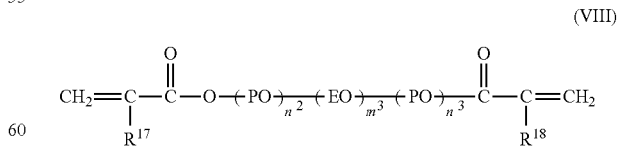

(VIII)

[In the formula, $R^{17}$ and $R^{18}$ each independently represents a hydrogen atom or a C1-C3 alkyl group, EO represents an ethylene glycol chain, PO represents a propylene glycol chain, $m^3$ is an integer of 1-30, and $n^2+n^3$ (average) is an integer of 1-30.]

[Chemical Formula 11]

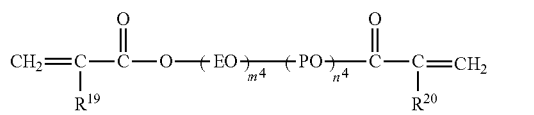
(IX)

[In the formula, $R^{19}$ and $R^{20}$ each independently represents a hydrogen atom or a C1-C3 alkyl group, EO represents an ethylene glycol chain, PO represents a propylene glycol chain, and $m^4$ and $n^4$ is each independently integers of 1-30.]

Examples of C1-C3 alkyl groups for formulas (VII), (VIII) and (IX) include methyl group, ethyl group, normal-propyl group and isopropyl group.

The total numbers of repeating ethylene glycol chains in formulas (VII), (VIII) and (IX) ($m^1+m^2$, $m^3$ and $m^4$) is each independently preferably an integer of 1-30, more preferably an integer of 1-10, even more preferably an integer of 4-9 and most preferably an integer of 5-8. When the number of repeats exceeds 30, the tent reliability and resist shape tends to be poor.

The total numbers of repeating propylene glycol chains in formulas (VII), (VIII) and (IX) ($n^1$, $n^2+n^3$ and $n^4$) is each independently preferably an integer of 1-30, more preferably an integer of 5-20, even more preferably an integer of 8-16 and most preferably an integer of 10-14. When the number of repeats exceeds 30, the resolution may be poor and sludge tends to be produced.

A specific example of a compound represented by formula (VII) is a vinyl compound wherein $R^{15}$ and $R^{16}$ are methyl groups, $m^1+m^2=6$ (average) and $n^1=12$ (average) (trade name: FA-023M by Hitachi Chemical Co., Ltd.). A specific example of a compound represented by formula (VIII) is a vinyl compound wherein $R^{17}$ and $R^{18}$ are methyl groups, $m^3=6$ (average) and $n^2+n^3=12$ (average) (trade name: FA-024M by Hitachi Chemical Co., Ltd.). A specific example of a compound represented by formula (IX) is a vinyl compound wherein $R^{19}$ and $R^{20}$ are hydrogen atoms, $m^4=1$ (average) and $n^4=9$ (average) (sample name: NK Ester HEMA-9P by Shin-Nakamura Chemical Co., Ltd.). These may be used alone or in combinations of two or more.

When a polyalkyleneglycol di(meth)acrylate having both an ethylene glycol chain and a propylene glycol chain in the molecule is used, the content is preferably 1-20 parts by weight and more preferably 3-15 parts by weight, based on 100 parts by weight as the total of the component (A) and the component (B).

The content of the photopolymerizing compound as the component (B) is preferably 30-70 parts by weight, more preferably 35-65 parts by weight and even more preferably 40-60 parts by weight based on 100 parts by weight as the total of the component (A) and the component (B). A content of less than 30 parts by weight tends to prevent satisfactory sensitivity and resolution from being obtained, while a content of greater than 70 parts by weight tends to prevent a satisfactory resist shape from being obtained.

When a combination of (B1) a photopolymerizable unsaturated compound with one polymerizable ethylenic unsaturated bond in the molecule and (B2) a photopolymerizable unsaturated compound with two or more polymerizable ethylenic unsaturated bonds in the molecule is used, the content ratio is preferably (B1)/(B2)=5/95-30/70 and more preferably 10/90-25/75, from the viewpoint of sensitivity, resolution, adhesiveness, release property and resist shape.

The photopolymerization initiator as the component (C) will now be described.

Examples for the (C) photopolymerization initiator include aromatic ketones such as 4,4'-bis(diethylamino)benzophenone, benzophenone and 2-benzyl-2-dimethylamino-1-(4-morpholinophenyl)-butanone-1,2-methyl-1-[4-(methylthio)phenyl]-2-morpholino-propanone-1; quinones such as alkylanthraquinone; benzoinether compounds such as benzoinalkyl ether; benzoin compounds such as benzoin and alkylbenzoin; benzyl derivatives such as benzyldimethylketal; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer, and acridine derivatives such as 9-phenylacridine and 1,7-bis(9,9'-acridinyl)heptane.

The component (C) according to this embodiment preferably contains a 2,4,5-triarylimidazole dimer from the viewpoint of adhesiveness and sensitivity. The aryl substituents of any two 2,4,5-triarylimidazoles may be identical for a symmetrical compound, or they may be different for an asymmetrical compound. They may be used alone or in combinations of two or more.

The content of the photopolymerization initiator as the component (C) is preferably 0.1-10 parts by weight, more preferably 2-6 parts by weight and even more preferably 3.5-5 parts by weight based on 100 parts by weight as the total of the component (A) and the component (B). A content of less than 0.1 part by weight tends to prevent a satisfactory sensitivity and resolution from being obtained, while a content of greater than 10 parts by weight tends to prevent satisfactory pattern shape from being obtained. These may also be used alone or in combinations of two or more.

The photosensitive resin composition of the invention also preferably contains a sensitizing dye as the component (D).

The sensitizing dye of the component (D) according to the invention allows more effective utilization of the absorption wavelength of the active light rays used. When a 405 nm violet laser diode is used as the light source, the sensitizing dye is preferably a compound with a maximum absorption wavelength of 370 nm-420 nm. Using such a sensitizing dye according to the invention can provide sufficiently high sensitivity for exposure light in direct writing exposure methods. When the maximum absorption wavelength of the sensitizing dye is less than 370 nm, the sensitivity for direct writing exposure light tends to be reduced, and when it is greater than 420 nm, the stability in yellow light environments tends to be lower.

Examples for the (D) sensitizing dye of the invention include pyrazolines, anthracenes, coumarins, xanthones, oxazoles, benzooxazoles, thiazoles, benzothiazoles, triazoles, stilbenes, triazines, thiophenes, naphthalimides and tertiary amines.

When exposure is performed using a 405 nm violet laser diode as the light source, pyrazolines are preferred among these (D) sensitizing dyes from the viewpoint of higher molar extinction coefficient at 405 nm and improved resolution and adhesiveness with smaller amounts.

The content of the (D) sensitizing dye is preferably 0.01-10 parts by weight, more preferably 0.05-5 parts by weight and even more preferably 0.1-2 parts by weight with respect to 100 parts by weight as the total of the component (A) and the component (B). A content of less than 0.01 part by weight tends to prevent satisfactory sensitivity and resolution from being obtained, while a content of greater than 10 parts by weight tends to prevent a satisfactory resist shape from being obtained. These may also be used alone or in combinations of two or more.

The photosensitive resin composition of the invention preferably further includes an amine-based compound as component (E). The (E) amine-based compound may be bis[4-(dimethylamino)phenyl]methane, bis[4-(diethylamino)phenyl]methane, leuco crystal violet, or the like.

The content of the (E) amine-based compound is preferably 0.01-10 parts by weight, more preferably 0.05-5 parts by weight and even more preferably 0.1-2 parts by weight with respect to 100 parts by weight as the total of the component (A) and the component (B). A content of less than 0.01 parts by weight tends to prevent satisfactory sensitivity from being obtained, while a content of greater than 10 parts by weight tends to cause deposition of contaminants after film formation. These may also be used alone or in combinations of two or more.

The photosensitive resin composition may, if necessary, contain a photopolymerizing compound having at least one cationic polymerizable cyclic ether group in the molecule (an oxetane compound or the like), a cationic polymerization initiator, a dye such as malachite green, a photochromic agent such as tribromophenylsulfone or leuco crystal violet, a thermal chromogenic inhibitor, a plasticizer such as p-toluenesulfonamide, a pigment, filler, antifoaming agent, flame retardant, stabilizer, tackifier, leveling agent, release promoter, antioxidant, aromatic, imaging agent, thermal crosslinking agent, or the like, at about 0.01-20 parts by weight each with respect to 100 parts by weight as the total of the component (A) and the component (B). They may be used alone or in combinations of two or more.

The photosensitive resin composition of the invention may be used as a solution in a solvent such as methanol, ethanol, acetone, methyl ethyl ketone, methylcellosolve, ethylcellosolve, toluene, N,N-dimethylformamide or propyleneglycol monomethyl ether, or a mixture of such solvents, at a solid content of about 30-60% by mass. The solution may be used as a coating solution for formation of a photosensitive resin composition layer on a photosensitive element.

The coating solution may be used to form a photosensitive resin composition layer on a photosensitive element by application and drying on a support film as described hereunder, and for example, it may be applied as a liquid resist coating onto the surface of a metal sheet, for example, an iron-based alloy such as copper, copper-based alloy, nickel, chromium, iron, stainless steel or the like, and preferably onto the surface of copper, a copper-based alloy or an iron-based alloy, and then dried and covered with a protective film.

The layer thickness of the photosensitive resin composition layer may differ depending on the purpose of the photosensitive element, but it is preferably about 1-100 μm as the post-drying thickness. When the protective film is to be used to cover the liquid resist mentioned above, the protective film may be a polymer film such as polyethylene or polypropylene.

(Photosensitive Element)

A photosensitive element according to the invention will now be explained. The photosensitive element of the invention has at least a support film and a photosensitive resin composition layer formed on the support film.

FIG. 1 is a schematic cross-sectional view showing a preferred embodiment of a photosensitive element of the invention. The photosensitive element 1 shown in FIG. 1 has a structure with a photosensitive resin composition layer 3 laminated on a support 2. The photosensitive resin composition layer 3 is a layer composed of a photosensitive resin composition of the invention as described above. The side of the photosensitive resin composition layer 3 opposite the support side in the photosensitive element 1 may be covered with a protective film 4 if necessary.

The support film 2 may be a polymer film having heat resistance and solvent resistance, such as polyethylene terephthalate, polypropylene, polyethylene or polyester, for example. The thickness of the support film (polymer film) 2 is preferably 1-100 μm and more preferably 5-25 μm. When the thickness is less than 1 μm, the support film may be prone to tearing during its release, and when it is greater than 100 μm, the resolution tends to be reduced. Incidentally, one polymer film may be used as the support for the photosensitive resin composition layer 3, while another is used as a protective film 4 for the photosensitive resin composition, thus being laminated on both sides of the photosensitive resin composition layer.

The protective film 4 is preferably one such that the adhesive force between the photosensitive resin composition layer and the protective film is lower than the adhesive force between the photosensitive resin composition layer and the support, and it is also preferably a low-fisheye film. "Fisheyes" are contaminants, insoluble matter and oxidative degradation products that become incorporated into films during their production by heat-fusion, kneading, extrusion, biaxial stretching and casting of film materials.

The protective film 4 may be a polymer film having heat resistance and solvent resistance, such as polyethylene terephthalate, polypropylene, polyethylene or polyester, for example. Examples of commercially available products include "ALPHAN MA-410" and "E-200C" by Oji Paper Co., Ltd., polypropylene films by Shin-Etsu Film Co., Ltd. or polyethylene terephthalate films of the PS series such as "PS-25" by Teijin, Ltd., but there is no restriction to these.

The thickness of the protective film is preferably 1-100 μm, more preferably 5-50 μm, even more preferably 5-30 μm and most preferably 15-30 μm. When the thickness is less than 1 μm, the protective film tends to tear during lamination, while when it is greater than 100 μm the cost of the film may be increased.

The photosensitive resin composition layer is preferably formed by dissolving the photosensitive resin composition of the invention in a solvent as described above to make a solution (coating solution) with a solid content of about 30-60% by mass and then applying the solution (coating solution) onto the support film and drying it. The coating may be accomplished by a publicly known method using, for example, a roll coater, comma coater, gravure coater, air knife coater, die coater, bar coater or the like. The drying may be carried out at 70-150° C. for about 5-30 minutes. The amount of residual organic solvent in the photosensitive resin composition is preferably no greater than 2% by mass from the viewpoint of preventing diffusion of the organic solvent in subsequent steps.

The thickness of the photosensitive resin composition layer 3 may differ depending on the use, but the post-drying thickness is preferably 1-100 μm and more preferably 1-50 μm. A thickness of less than 1 μm tends to hamper industrial coating, while a thickness of greater than 100 μm tends to reduce the effect of the invention and lower the adhesive force and resolution.

The photosensitive resin composition layer preferably has a transmittance of 5-75%, more preferably 7-60% and most preferably 10-50%, for ultraviolet light with a wavelength of 365 nm. A transmittance of less than 5% tends to result in inferior adhesion, while a transmittance of greater than 75% tends to result in inferior resolution. The transmittance may be measured by a UV spectrometer, and the UV spectrometer may be a Model 228A W Beam spectrophotometer by Hitachi, Ltd.

The photosensitive element 1 of the invention may also comprise interlayers such as a cushion layer, adhesive layer, photoabsorbing layer and gas barrier layer as necessary. The obtained photosensitive element may be stored as a sheet or as a roll wound up on a winding core. In the latter case, it is preferably wound with the support on the outermost side. An edge separator is preferably situated at the edge of the photosensitive element roll from the viewpoint of edge protection, while from the viewpoint of preventing edge fusion, the edge separator is preferably moisture-proof. The packaging method is preferably one that involves bundling in a black sheet with low moisture permeability. The winding core may be, for example, a plastic such as polyethylene resin, polypropylene resin, polystyrene resin, polyvinyl chloride resin or ABS resin (acrylonitrile-butadiene-styrene copolymer).

(Method for Forming Resist Pattern)

A method for forming a resist pattern according to the invention will now be explained. The method for forming a resist pattern according to the invention comprises a lamination step in which a photosensitive resin composition layer composed of the photosensitive resin composition as described above is laminated on a circuit-forming board, an exposure step in which prescribed sections of the photosensitive resin composition layer are irradiated with active light rays for photocuring of the exposed sections, and a developing step in which the sections other than the exposed sections of the photosensitive resin composition layer are removed from the board. A "circuit-forming board" is a board comprising an insulating layer and a conductive layer formed on the insulating layer.

The method for laminating the photosensitive resin composition layer on the circuit-forming board in the lamination step may be a method in which, after removing the protective film, the photosensitive resin composition layer is heated while pressure bonding the photosensitive resin composition layer to the circuit-forming board. Specifically, the protective film of the photosensitive element of the invention described above is slowly released from the photosensitive resin composition layer, while the section of the photosensitive resin composition layer surface that becomes gradually exposed thereby is attached to the surface of the circuit-forming board on which the circuit is to be formed, to laminate the photosensitive resin composition layer on the circuit-forming board. The laminating procedure is preferably carried out under reduced pressure from the viewpoint of adhesiveness and follow-up property.

For lamination of the photosensitive element, the photosensitive resin composition layer and/or circuit-forming board is preferably heated to 70-130° C. and the pressure bonding force is preferably about 0.1-1.0 MPa (about 1-10 kgf/cm$^2$), although there is no particular restrictions to these conditions.

If the photosensitive resin composition layer is heated at 70-130° C. as mentioned above it is not necessary to subject the circuit-forming board to preheating beforehand, but the circuit-forming board may nevertheless be preheated for further enhanced laminating properties.

The method for forming the exposed sections in the subsequent exposure step may be a method for irradiation with active light rays onto an image, through a negative or positive mask pattern known as artwork (mask exposure method). When the support film on the photosensitive resin composition layer is transparent to the active light rays, the active light rays may be irradiated through the support film, and when the support film is non-transparent, the active light rays may be irradiated onto the photosensitive resin composition layer after removal of the support film. The active light rays may also be irradiated into an image by a direct writing method such as laser direct writing exposure or DLP (Digital Light Processing) exposure.

The light source for the active light rays may be a known light source such as a carbon arc lamp, mercury vapor arc lamp, high-pressure mercury lamp, xenon lamp or a gas laser such as an argon laser, a solid laser such as a YAG laser, or an effective emitter of ultraviolet rays such as a semiconductor laser, or visible light.

The method for removing the sections other than the exposed sections in the developing step following exposure, when a support film is present on the photosensitive resin composition layer, may be a method in which the support film is first removed and then the sections other than the exposed sections are removed by development such as wet development, dry development or the like. This procedure results in formation of a resist pattern.

In the case of wet development, a developing solution suitable for photosensitive resin compositions may be used, such as an aqueous alkali solution, aqueous developing solution or organic solvent-based developing solution, and development may be accomplished by a publicly known method such as spraying, reciprocal dipping, brushing, scrapping or the like.

The developing solution used is one which is safe and stable and easily manageable, such as an aqueous alkali solution. Examples of bases to be used for the aqueous alkali solution include alkali metal hydroxides such as lithium, sodium or potassium hydroxides, alkali metal carbonates or alkali metal bicarbonates such as lithium, sodium or potassium carbonates or bicarbonates, ammonium carbonate or bicarbonate, alkali metal phosphates such as potassium phosphate and sodium phosphate, and alkali metal pyrophosphates such as sodium pyrophosphate and potassium pyrophosphate.

The aqueous alkali solution used for development is preferably a 0.1-5% by mass sodium carbonate dilute solution, a 0.1-5% by mass potassium carbonate dilute solution, a 0.1-5% by mass sodium hydroxide dilute solution or a 0.1-5% by mass sodium tetraborate dilute solution. The pH of the aqueous alkali solution used for development is preferably in the range of 9-11, and the temperature is adjusted as appropriate for the developing property of the photosensitive resin composition layer. The aqueous alkali solution may also contain added surfactants, antifoaming agents, and small amounts of organic solvent to accelerate development.

An aqueous developing solution used may be composed of water and an aqueous alkali solution or one or more different organic solvents. As examples of bases for aqueous alkali solutions other than those already referred to above there may be mentioned borax, or sodium metasilicate, tetramethylammonium hydroxide, ethanolamine, ethylenediamine, diethylenetriamine, 2-amino-2-hydroxymethyl-1,3-propanediol, 1,3-diaminopropanol-2, morpholine and the like. The pH of the developing solution is preferably in a range allowing sufficient development of the resist, and is preferably pH 8-12 and more preferably pH 9-10.

Examples of organic solvents include acetone, ethyl acetate, alkoxyethanols with C1-C4 alkoxy groups, ethyl alcohol, isopropyl alcohol, butyl alcohol, diethyleneglycol monomethyl ether, diethyleneglycol monoethyl ether, diethyleneglycol monobutyl ether and the like. They may be used alone or in combinations of two or more. The concentration of the organic solvent is normally preferred to be 2-90% by mass, and the temperature may be adjusted as appropriate for the developing property. The aqueous developing solution may also contain small amounts of added surfactants, antifoaming agents and the like. Examples of organic solvent-based developing solutions to be used alone include 1,1,1-trichloroethane, N-methylpyrrolidone, N,N-dimethylformamide, cyclohexanone, methyl isobutyl ketone and γ-butyrolactone.

Water is preferably added to these organic solvents in a range of 1-20% by mass for anti-flammability. Two or more different developing methods may also be carried out in combination if necessary. The developing system may be a dip system, paddle system, spray system or employ brushing, slapping or the like, but a high-pressure spray system is most suitable for improved resolution.

The developing system may be, for example, a dip system, a spray system, brushing system, slapping system or the like. Post-development treatment may include heating at about 60-250° C. or exposure at about 0.2-10 J/cm$^2$ if necessary for further curing of the resist pattern. Etching of the metal surface after development may be accomplished using, for example, a cupric chloride solution, ferric chloride solution, alkali etching solution or the like.

(Method for Producing Printed Wiring Board)

The method for producing a printed wiring board according to the invention will now be explained. The method for producing a printed wiring board according to the invention is a process wherein a circuit-forming board having a resist pattern formed by the method for forming a resist pattern of the invention is etched or plated.

The etching or plating of the circuit-forming board is carried out on the conductive layer of the circuit-forming board using the formed resist pattern as a mask. The etching solution used for etching may be a cupric chloride solution, ferric chloride solution, alkali etching solution, hydrogen peroxide etching solution or the like, with a ferric chloride solution being preferred for a more satisfactory etch factor. The method used for plating may be, for example, copper plating such as copper sulfate plating or copper pyrophosphate plating, solder plating such as high throwing solder plating, nickel plating such as Watt bath (nickel sulfate-nickel chloride) plating or nickel sulfaminate plating, or gold plating such as hard gold plating or soft gold plating.

After completion of the etching or plating, the resist pattern is released, for example, with an aqueous solution of stronger alkalinity than the aqueous alkali solution used for development. The strongly alkaline aqueous solution used here may be, for example, a 1-10% by mass sodium hydroxide aqueous solution or a 1-10% by mass potassium hydroxide aqueous solution. The releasing system may be, for example, a dipping system, spraying system or the like, and a dipping or spraying system may be used either alone or in combination. The printed wiring board on which the resist pattern has been formed may be a multilayer printed wiring board, and it may also have small through-holes. A printed wiring board is obtained in the manner described above.

By using the photosensitive resin composition and photosensitive element of the invention to form a resist pattern by the series of steps described above, and etching or plating the circuit-formed board over which the resist pattern has been formed, it is possible to produce a printed wiring board with very high production efficiency, especially for laser direct writing.

EXAMPLES

Preferred examples of the invention will now be explained in greater detail, with the understanding that these examples are in no way limitative on the invention.

(Synthesis of Binder Polymer (Component A))

In a flask equipped with a stirrer, reflux condenser, thermometer, dropping funnel and nitrogen gas inlet tube there was added 450 g of a mixture of propyleneglycol monomethyl ether and toluene in a mass ratio of 3:2, and the mixture was stirred while blowing in nitrogen gas and heated to 80° C. Separately, there was prepared a solution comprising a mixture of 150 g of methacrylic acid, 175 g of t-butyl methacrylate (Wako Pure Chemical Industries, Ltd.), 175 g of styrene as copolymerizing monomers and 9.0 g of azobisisobutyronitrile (hereinafter referred to as "solution (a)"). Solution (a) was added dropwise over a period of 4 hours to a mixture of propyleneglycol monomethyl ether and toluene in a mass ratio of 3:2 that had been heated to 80° C., and the mixture was warmed for 2 hours while stirring at 80° C. Also, a solution of 1.2 g of azobisisobutyronitrile dissolved in 100 g of a mixture of propyleneglycol monomethyl ether and toluene in a mass ratio of 3:2 was added dropwise to the flask over a period of 10 minutes. After keeping the dropped solution at 80° C. for 3 hours while stirring, it was heated to 90° C. over a period of 30 minutes. The solution was warmed at 90° C. for 2 hours, and then cooled to obtain a binder polymer (A-1).

The nonvolatile portion (solid portion) of the solution of the binder polymer was 47.8% by mass, and the weight-average molecular weight was 41,000. The weight-average molecular weight was measured by gel permeation chromatography, and calculation was performed using a standard polystyrene calibration curve. The GPC conditions were as follows.

Pump: Hitachi L-6000 (Hitachi, Ltd.)
Column: Gelpack GL-R420+Gelpack GL-R430+Gelpack GL-R440 (total: 3) [all trade names of Hitachi Chemical Co., Ltd.]
Eluent: tetrahydrofuran
Measuring temperature: 40° C.
Flow rate: 2.05 mL/min
Detector: Hitachi L-3300 RI (Hitachi, Ltd.).

Binder polymers (A-2) to (A-9) were synthesized by the same method as the synthesis method for binder polymer (A-1) described above, using the compositions listed in Table 1.

TABLE 1

|  | A-1 | A-2 | A-3 | A-4 | A-5 | A-6 | A-7 | A-8 | A-9 |
|---|---|---|---|---|---|---|---|---|---|
| Methacrylic acid | 30 | 25 | 30 | 25 | 25 | 30 | 30 | 30 | 25 |
| Styrene | 35 | 45 | 35 | 50 | 40 | 35 | 35 | 35 | 0 |
| t-Butyl methacrylate | 35 | 30 | 0 | 0 | 0 | 0 | 0 | 0 | 35 |
| Isopropyl methacrylate | 0 | 0 | 35 | 0 | 0 | 0 | 0 | 0 | 0 |

TABLE 1-continued

|  | A-1 | A-2 | A-3 | A-4 | A-5 | A-6 | A-7 | A-8 | A-9 |
|---|---|---|---|---|---|---|---|---|---|
| Methyl methacrylate | 0 | 0 | 0 | 25 | 35 | 0 | 0 | 0 | 40 |
| n-Butyl methacrylate | 0 | 0 | 0 | 0 | 0 | 35 | 0 | 0 | 0 |
| 2-Ethylhexyl methacrylate | 0 | 0 | 0 | 0 | 0 | 0 | 35 | 0 | 0 |
| Dodecyl methacrylate | 0 | 0 | 0 | 0 | 0 | 0 | 0 | 35 | 0 |
| Acid value (mgKOH/g) | 196 | 163 | 196 | 163 | 163 | 196 | 196 | 196 | 163 |
| Weight-average molecular weight | 41,000 | 40,000 | 39,000 | 41,000 | 38,000 | 41,000 | 37,000 | 30,000 | 45,000 |

Component (A) is listed as solid content, while the numerical values of each of the components is represented as mass ratios.

(Preparation of Photosensitive Resin Composition)

The binder polymers (A-1) to (A-9) were combined with the following materials in the mass ratios (solid content for component (A)) listed in Table 2, to prepare photosensitive resin composition solutions for Examples 1-10 and Comparative Examples 1-6.

<Photopolymerizing compound (component (B))>

B-1: 2,2-bis(4-(Methacryloxypentaethoxy)phenyl)propane (trade name: "FA-321 M" by Hitachi Chemical Co., Ltd.)

B-2: Compound represented by formula (VIII) above; vinyl compound wherein $R^{17}=R^{18}$=methyl group, $m^3$=6 (average) and $n^2+n^3$=12 (average) (trade name: "FA-024M" by Hitachi Chemical Co., Ltd.).

B-3: 4-normal-Nonylphenoxyoctaethyleneglycol acrylate (trade name: "M-114" by ToaGosei Co., Ltd.)

B-4: BPE-100 (trade name of Shin-Nakamura Chemical Co., Ltd.); 2,2-bis[4-(methacryloylethoxy)phenyl]propane (EO:2.6 mol)

B-5: TMPT21E (trade name of Hitachi Chemical Co., Ltd.): EO-modified trimethylolpropane trimethacrylate (EO:21 mol)

B-6: FA-MECH (trade name of Hitachi Chemical Co., Ltd.): γ-chloro-β-hydroxypropyl-β'-(meth)acryloyloxyethyl-o-phthalate <Photopolymerization Initiator (Component (C))>

C-1: 2,2'-bis(2-Chlorophenyl)-4,4',5,5'-tetraphenylbisimidazole (trade name: "BCIM" by Hampford)

<Sensitizing dye (component (D))>

D-1: 9,10-Dibutoxyanthracene (trade name: "DBA" by Kawasaki Kasei Chemicals, Ltd., maximum absorption wavelengths [λn]=368 nm, 388 nm, 410 nm)

(D-2) 1-Phenyl-3-(4-t-butylstyryl)-5-(4-t-butylphenyl)pyrazoline (by Nippon Chemical Industrial Co., Ltd., maximum absorption wavelength [λn]=387.2 nm)

(D-3) 1-Phenyl-3-(4-methoxystyryl)-5-(4-methoxyphenyl)pyrazoline (by Nippon Chemical Industrial Co., Ltd., maximum absorption wavelength [λn]=385.2 nm)

(D-4) 1-Phenyl-3-(4-isopropylstyryl)-5-(4-isopropylphenyl)pyrazoline (by Nippon Chemical Industrial Co., Ltd., maximum absorption wavelength [λn]=386.2 nm)

(D-5) J205 (trade name of Nihon Jyoryu Kogyo Co., Ltd., compound represented by following formula, maximum absorption wavelength [λn]=410 nm)

[Chemical Formula 12]

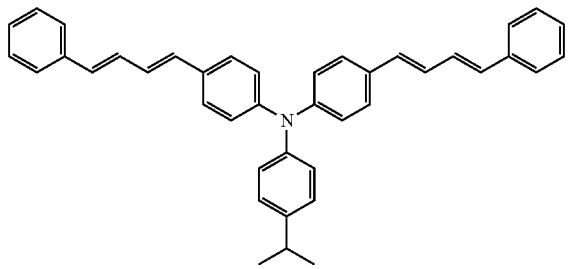

<Coloring Agent (Amine Compound) (Component (E))>

E-1: Leuco crystal violet (Yamada Kagaku Co., Ltd.)

<Dye>

Malachite green (Osaka Organic Chemical Industry, Ltd.)

<Solvents>

Acetone

Toluene

Methanol

TABLE 2

|  |  | Example | | | Comp. Ex. | | | | | |
|---|---|---|---|---|---|---|---|---|---|---|
|  |  | 1 | 2 | 3 | 1 | 2 | 3 | 4 | 5 | 6 |
| Component (A) | A-1 | 50 | — | — | — | — | — | — | — | — |
|  | A-2 | — | 50 | — | — | — | — | — | — | — |
|  | A-3 | — | — | 50 | — | — | — | — | — | — |
|  | A-4 | — | — | — | 50 | — | — | — | — | — |
|  | A-5 | — | — | — | — | 50 | — | — | — | — |
|  | A-6 | — | — | — | — | — | 50 | — | — | — |
|  | A-7 | — | — | — | — | — | — | 50 | — | — |
|  | A-8 | — | — | — | — | — | — | — | 50 | — |
|  | A-9 | — | — | — | — | — | — | — | — | 50 |
| Component (B) | B-1 | 25 | | | | | | | | |
|  | B-2 | 15 | | | | | | | | |
|  | B-3 | 10 | | | | | | | | |
| Component (C) | C-1 | 3.7 | | | | | | | | |
| Component (D) | D-1 | 0.7 | | | | | | | | |
| Component (E) | E-1 | 0.5 | | | | | | | | |
| Dye | Malachite green | 0.03 | | | | | | | | |
| Solvent | Acetone | 5 | | | | | | | | |
|  | Toluene | 9 | | | | | | | | |
|  | Methanol | 5 | | | | | | | | |

TABLE 3

| | | Example | | | | | | |
|---|---|---|---|---|---|---|---|---|
| | | 4 | 5 | 6 | 7 | 8 | 9 | 10 |
| Component (A)* | A-1 | — | — | — | — | — | — | — |
| | A-2 | 55 | 55 | 55 | 55 | 55 | 55 | 55 |
| | A-3 | — | — | — | — | — | — | — |
| | A-4 | — | — | — | — | — | — | — |
| | A-5 | — | — | — | — | — | — | — |
| | A-6 | — | — | — | — | — | — | — |
| | A-7 | — | — | — | — | — | — | — |
| Component (B) | B-1 | 10 | 15 | 15 | 15 | 15 | 15 | 15 |
| | B-2 | 10 | 10 | 5 | 5 | 5 | 5 | 5 |
| | B-3 | — | — | — | — | — | — | — |
| | B-4 | 10 | 10 | 10 | 10 | 10 | 10 | 10 |
| | B-5 | 10 | 5 | 10 | 10 | 10 | 10 | 10 |
| | B-6 | 5 | 5 | 5 | 5 | 5 | 5 | 5 |
| Component (C) | C-1 | 3.7 | 3.7 | 3.7 | 3.7 | 3.7 | 3.7 | 3.7 |
| Component (D) | D-1 | 0.6 | 0.6 | 0.6 | — | — | — | — |
| | D-2 | — | — | — | 0.2 | — | — | — |
| | D-3 | — | — | — | — | 0.2 | — | — |
| | D-4 | — | — | — | — | — | 0.2 | — |
| | D-5 | — | — | — | — | — | — | 0.15 |
| Component (E) | E-1 | 0.5 | 0.5 | 0.5 | 0.5 | 0.5 | 0.5 | 0.5 |
| Dye | Malachite green | 0.03 | 0.03 | 0.03 | 0.03 | 0.03 | 0.03 | 0.03 |
| Solvent | Acetone | 5 | 5 | 5 | 5 | 5 | 5 | 5 |
| | Toluene | 9 | 9 | 9 | 9 | 9 | 9 | 9 |
| | Methanol | 5 | 5 | 5 | 5 | 5 | 5 | 5 |

*Solid content (Fabrication of Photosensitive Elements)
A solution of the obtained photosensitive resin composition was evenly coated onto a 16 μm-thick polyethylene terephthalate film ("HTF-01", trade name of Teijin, Ltd.) as the support film. Next, a hot air convection drier was used for drying at 70° C. and 110° C. to form a photosensitive resin composition layer with a post-drying thickness of 25 μm. Next, a protective film ("NF-15", product name of Tamapoly Co., Ltd.) was laminated on the photosensitive resin composition layer by roll pressing, to obtain a photosensitive element for each of Examples 1-10 and Comparative Examples 1-6.

(Fabrication of Test Pieces)
Next, the copper surface of a copper-clad laminate (trade name: MCL-E-67 by Hitachi Chemical Co., Ltd.), which was a glass epoxy material laminated on both sides with copper foil (35 mm thickness), was polished using a polishing machine with a #600-equivalent brush (Sankei Co., Ltd.), and after cleaning with water, it was dried with an air stream to obtain a copper-clad laminate (board). The copper-clad laminate was then heated to 80° C., the protective film of each photosensitive element was removed while bonding each photosensitive resin composition layer onto the surface of the copper-clad laminate, and lamination (layering) was performed at 120° C. under a pressure of 4 kgf/cm² to fabricate test pieces.

(Evaluation of Properties)
<Sensitivity>
Each photosensitive element-laminated copper-clad laminate was cooled, and upon reaching 23° C., there were contact bonded onto the support film a phototool having a 41-step tablet with a density range of 0.00-2.00, a density step of 0.05, a tablet size of 20 mm×187 mm and a step size of 3 mm×12 mm A "DE-1AH" (trade name) direct imager by Hitachi Via Mechanics, Ltd., having a 405 nm violet laser diode as the light source, was used for exposure (drawing) onto the photosensitive resin composition layer through a phototool and support film with an exposure dose of 70 mJ/cm². The measurement of illuminance was performed using an ultraviolet illuminometer employing a 405 nm-corresponding probe (trade name: UIT-150 by Ushio Inc.).

Next, the polyethylene terephthalate film serving as the support film was released and 1% by mass aqueous sodium carbonate at 30° C. was sprayed for 24 seconds to remove the unexposed sections of the photosensitive resin composition layer, as development. The number of steps of the step tablet of the photocured film formed on the copper-clad laminate was then measured to evaluate the photosensitivity of the photosensitive resin composition. The obtained results are shown in Tables 5 and 6. The photosensitivity is indicated by the number of steps of the step tablet, with a higher step tablet step number representing higher photosensitivity.

<Resolution and Adhesiveness>
The test piece was exposed (drawn) on the photosensitive resin composition layer via a support film at an exposure dose of 70 mJ/cm², using a drawing pattern with a line width/space width of 6/6-22/22 (units: μm). Next, the resolution and adhesiveness were evaluated using the lowest value for the line width/space width which allowed clean removal of the unexposed sections by developing treatment (spraying for 24 seconds with a 1% by mass aqueous sodium carbonate at 30° C.) and formation of equal line widths and space widths without line meandering or defects. Small values are desirable for the resolution and adhesiveness. The obtained results are shown in Tables 5 and 6.

<Resist Shape>
The resist shape after development (line width: 12 μm) was observed using a Hitachi S-500A Scanning Electron Microscope, and evaluated on the scale shown below. When the cross-sectional shape of the resist is trapezoidal or reverse trapezoidal, or the resist has skirt trailing, the circuit formed by the subsequent etching treatment or plating treatment may exhibit shorting or wire breakage. It is preferable that the resist shape therefore has a rectangular cross-sectional shape of the resist, with no skirt trailing. The obtained results are shown in Tables 5 and 6.

A: Rectangular cross-sectional shape of resist, with no skirt trailing.

B: Rectangular cross-sectional shape of resist, with skirt trailing.

C: Non-rectangular cross-sectional shape of resist, with no skirt trailing.

D: Non-rectangular cross-sectional shape of resist, with skirt trailing.

<Release Property>
Photosensitive resin composition layers according to each of the examples and comparative examples was formed on copper clad laminates, and exposure and development of each photosensitive resin composition layer was performed under the conditions listed in Table 4, to fabricate photocured films with sizes of 40 mm×50 mm A 3% sodium hydroxide aqueous solution was also used for release. The release property was evaluated based on the release time and release strip size. The release time was defined as the time to complete release and removal of the photocured film from the copper clad laminate upon spraying with the developing solution. The release strip size after release was visually observed and the release strip size was evaluated based on the scale shown in Table 4. The obtained results are shown in Tables 5 and 6.

TABLE 4

| Process | Conditions |
|---|---|
| Exposure | Exposure dose: 70 mJ/cm$^2$, Size: 40 mm × 50 mm |
| Development | Developing solution: 1% Na$_2$CO$_3$, Solution temperature: 30° C., Spray system |
| Release | Release solution: 3% NaOH, Solution temperature: 50° C., With dip stirring Release strip size: L: ≥40 mm sq., M: 30-40 mm sq., S: ≤30 mm sq. |

TABLE 5

| | Example | | | Comp. Ex. | | | | | |
|---|---|---|---|---|---|---|---|---|---|
| | 1 | 2 | 3 | 1 | 2 | 3 | 4 | 5 | 6 |
| Sensitivity (ST step/41) | 13 | 13 | 12 | 13 | 11 | 12 | 12 | 11 | 12 |
| Resolution and adhesiveness (μM) | 9 | 9 | 11 | 16 | 18 | 18 | 20 | 22 | 20 |
| Release time (sec) | 88 | 98 | 75 | 50 | 40 | 62 | 71 | 93 | 45 |
| Release strip size | S | S | S | S | S | S | S | S | S |
| Resist shape | A | A | A | B | B | B | B | D | D |

TABLE 6

| | Example | | | | | | |
|---|---|---|---|---|---|---|---|
| | 4 | 5 | 6 | 7 | 8 | 9 | 10 |
| Sensitivity (ST step/41) | 13 | 13 | 13 | 13 | 13 | 13 | 14 |
| Resolution and adhesiveness (μM) | 8 | 7 | 7 | 7 | 7 | 7 | 7 |
| Release time (sec) | 62 | 65 | 63 | 60 | 58 | 60 | 62 |
| Release strip size | S | S | S | S | S | S | S |
| Resist shape | A | A | A | A | A | A | A |

As clearly seen by the results in Tables 5 and 6, the resolution/adhesiveness (L/S) was satisfactory at 7-11 μm with the compositions of Examples 1-10, while the release times were suitably short and the release strip sizes were small, for a good balance between resolution/adhesiveness and release property. A desirable resist shape was also confirmed. In Comparative Examples 1-6, on the other hand, the resolution/adhesiveness was low despite a satisfactory release property, and the resist shape was not satisfactory.

As explained above, the photosensitive resin composition of the invention can suitably shorten the release time and allow the resist shape obtained after photocuring to be satisfactorily maintained, thus allowing efficient formation of a resist pattern so that the production efficiency of printed wiring boards can be further increased.

EXPLANATION OF SYMBOLS

1: Photosensitive element, 2: support film, 3: photosensitive resin composition layer, 4: protective film.

The invention claimed is:

1. A photosensitive resin composition comprising:
(a) a binder polymer having a divalent group represented by formula (I), (II) and (III);
(b) a photopolymerizing compound;
(c) a photopolymerization initiator; and
(d) a sensitizing dye,

[Chemical Formula 1]

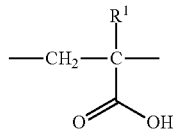

(I)

[Chemical Formula 2]

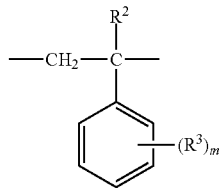

(II)

[Chemical Formula 3]

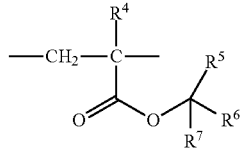

(III)

wherein R$^1$, R$^2$ and R$^4$ each independently represents a hydrogen atom or a methyl group, R$^3$ represents C1-C3 alkyl group, a C1-C3 alkoxy group, a hydroxyl group, an amino group or a halogen atom, m represents an integer of 0-5, and when m is 2-5, a plurality of the groups in R$^3$ may be the same or different, R$^5$, R$^6$ and R$^7$ each independently represents a hydrogen atom or a C1-C5 alkyl group, and at least two of R$^5$, R$^6$ and R$^7$ are C1-C5 alkyl groups, wherein the divalent group represented by formula (I) is 10-60% by mass of the total weight of the binder polymer molecule, wherein the divalent group represented by formula (II) is 10-70% by mass of the total weight of the binder polymer molecule, and wherein the divalent group represented by formula (III) is 5-60% by mass of the total weight of the binder polymer molecule.

2. A photosensitive resin composition according to claim 1, wherein the photopolymerization initiator contains a hexaarylbiimidazole derivative.

3. A photosensitive resin composition according to claim 1, further comprising an amine-based compound.

4. A photosensitive element comprising:
(a) a support film; and
(b) a photosensitive resin composition layer composed of a photosensitive resin composition according to claim 1, wherein the photosensitive resin composition layer is formed on the support film.

5. A method for forming a resist pattern, the method comprising the steps of
(a) laminating a photosensitive resin composition layer, composed of a photosensitive resin composition according to claim 1, on a circuit-forming board;
(b) exposing at least one prescribed section of the photosensitive resin composition layer so that the prescribed sections are irradiated with active light rays that photocure the exposed sections; and
(c) developing the resist pattern by removing one or more unexposed sections of the photosensitive resin composition layer from the circuit-forming board.

6. The method for forming a resist pattern according to claim 5, wherein the exposed sections are photocured by subjecting the photosensitive resin composition layer to direct writing exposure with laser light.

7. A method for producing a printed wiring board, the method comprising the steps of:
 (a) providing a circuit-forming board having a resist pattern formed by the method for forming a resist pattern according to claim 5; and
 (b) forming a conductor pattern by etching or plating the circuit-forming board.

* * * * *